United States Patent [19]
Adachi

[11] Patent Number: 5,663,980
[45] Date of Patent: Sep. 2, 1997

[54] SEMICONDUCTOR LASER DEVICE HAVING CHANGEABLE WAVELENGTH, POLARIZATION MODE, AND BEAM SHAPE IMAGE

[76] Inventor: Yoshi Adachi, 16214 Watson Cir., Westminster, Calif. 92683

[21] Appl. No.: 445,885

[22] Filed: May 22, 1995

[51] Int. Cl.[6] .................................................. H01S 3/08
[52] U.S. Cl. .................. 372/108; 372/19; 372/27; 372/103; 372/98; 372/34
[58] Field of Search .................. 372/25, 92, 19, 372/98, 102, 108, 103, 34, 27

[56] References Cited

U.S. PATENT DOCUMENTS 4,942,583  7/1990  Nazarathy et al. ............. 372/102
5,177,750  1/1993  Zorabedian ..................... 372/102

*Primary Examiner*—Leon Scott, Jr.
*Attorney, Agent, or Firm*—James T. English

[57] ABSTRACT

A semiconductor laser device that is modular can readily be changed to produce laser configurations for a broad spectrum of applications, using a minimum of components. A set of semiconductor modules covering wavelengths and polarizations of interest in specific technologies can be coupled to one of two beam shaping modules and projected through a selected objective optics module to provide large and small circular beams as well as broad and narrow line segments. Resolution enhancing and diffraction limiting filters may be included in the objective optics.

16 Claims, 3 Drawing Sheets

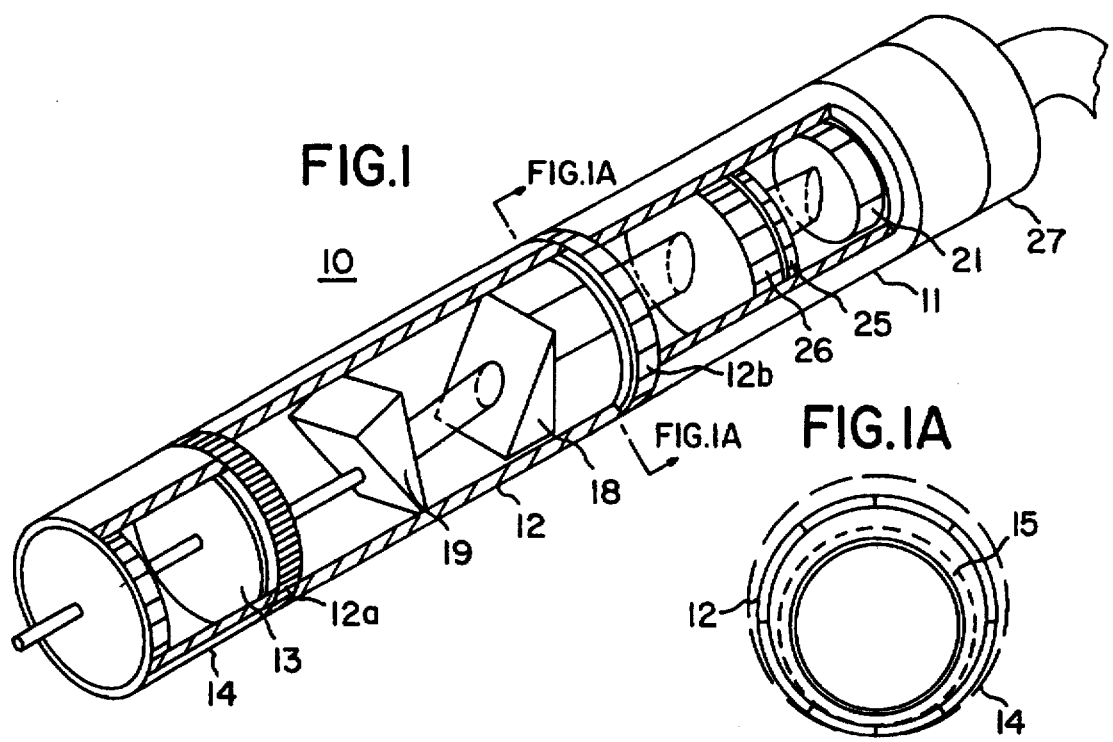
FIG. 1
FIG. 1A
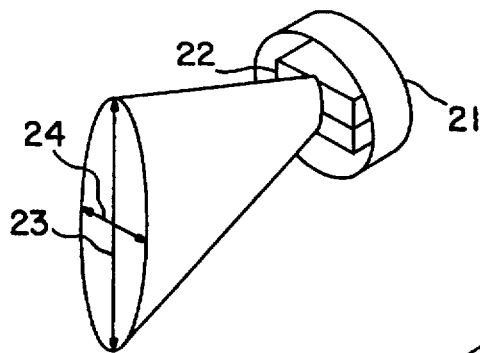
FIG. 2
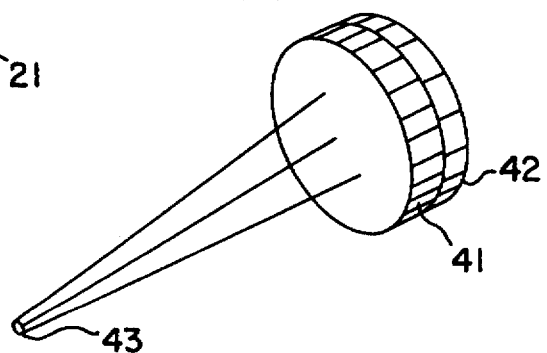
FIG. 4
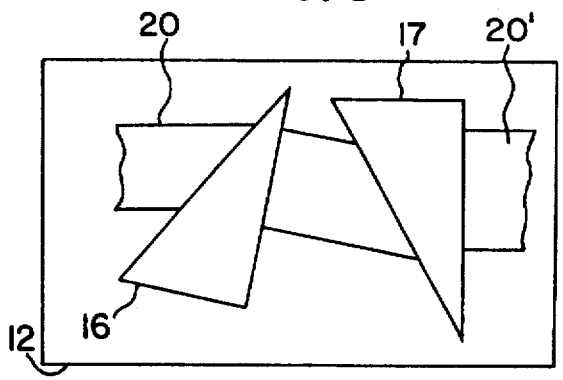
FIG. 3
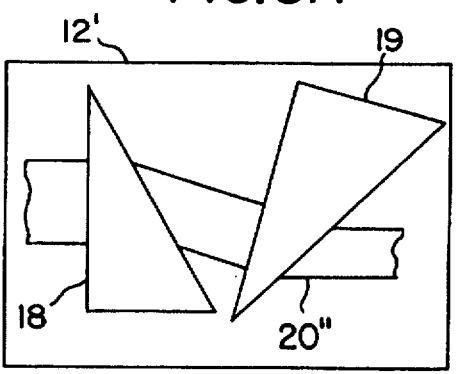
FIG. 3A

FIG. 4A
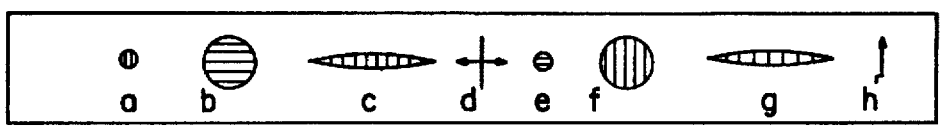
FIG. 4B
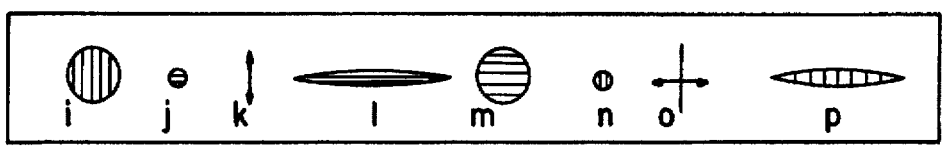
FIG. 6
| | | | |
|---|---|---|---|
| 3 | MgF2 | 134mm | N=1.38 |
| 2 | TiO2 | 134mm | N=2TO22 |
| 1 | AL2 O3 | 134mm | N=1.6 |
F2
N=1.614
FIG. 7
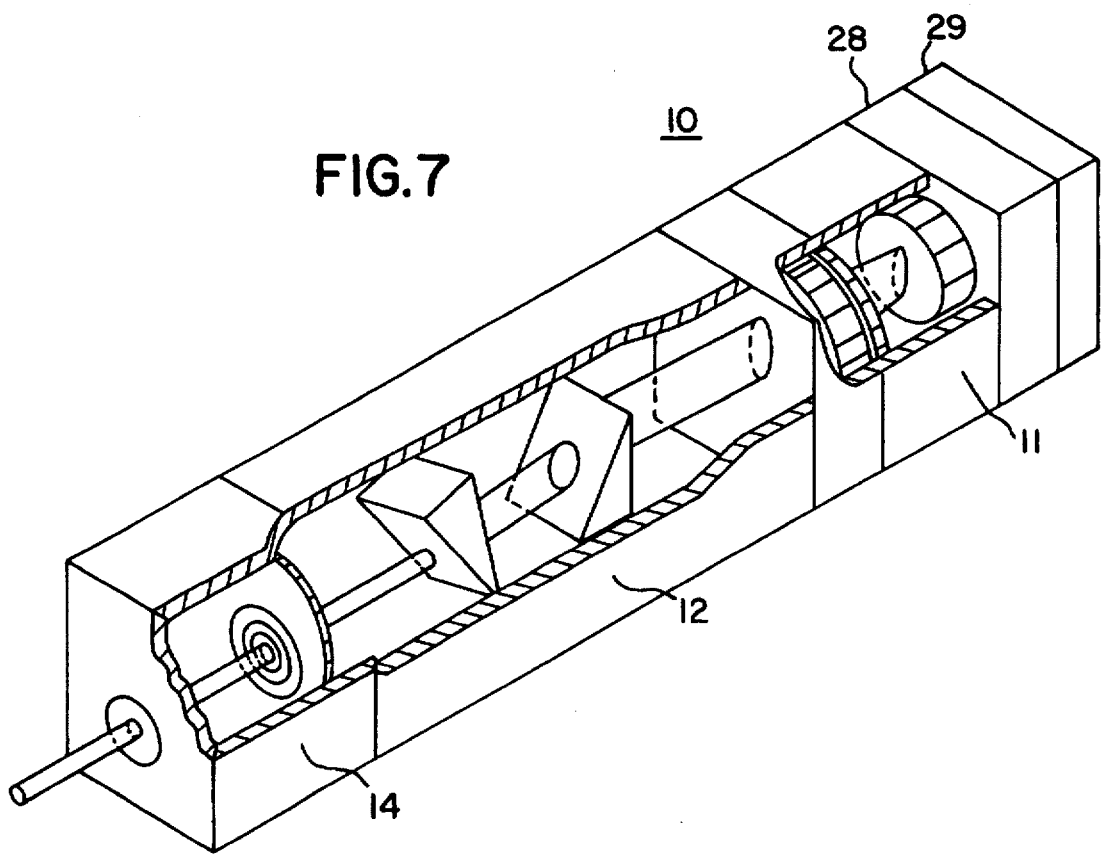

SEMICONDUCTOR LASER DEVICE HAVING CHANGEABLE WAVELENGTH, POLARIZATION MODE, AND BEAM SHAPE IMAGE

BACKGROUND OF THE INVENTION

1. Field of the Invention

This invention relates to semiconductor lasers and more particularly to a method and means for providing a choice of a plurality of collimated beam lasers having specific qualities for a multiplicity of applications requiring specific attributes of wavelength, polarization, and beam shape characteristics including expanded or reduced circle and broad or thin line characters. A choice of a plurality of focused beam lasers is also provided.

2. Description of the Prior Art

In the Near Infrared, 780–830 nanometer range lasers and including 670 nanometer laser, the polarization of the radiation is oriented parallel to the junction of the semiconductor laser; that is, along the minor axis with respect to the elliptical beam divergence of the semiconductor laser. The radiated beam can first be collimated and then expanded simply by using two prisms oriented along the minor axis of the beam, without any antireflection coatings on the hypotenuses of the prism pair for transmitting the TM mode without loss. An enlarged collimated circular beam results. An anti-reflection coating is placed on the hypotenuse of each prism to increase the polarization ratio; this principle is described in U.S. Pat. No. 4,609,258; to Adachi and Yamada. The enlarged, collimated round beam contains all the energy radiated by the TM polarizations of the beam.

If the prisms are placed in reverse order with respect to the laser; that is, rotated 180 degrees, with the right angle side perpendicular with respect to the radiated beam, with an antireflection coating on the hypotenuse of each prism, a shrunken circular beam spot is produced, and both TM and TE modes are passed without loss. These principles are expounded in the Adachi patent 5,321,717.

In addition, the following papers are important insofar as the resultant TE and TM modes of operation in semiconductor lasers is concerned:

Semiconductor Science and Technology; G. G. Forstman et. al. Pages 1268–1271; "Effects of Strain and GaInP$_2$ Superlattice" ordering on laser polarization.

IEEE Journal of Quantum Electronics, Vol. 24, No 12 Dec. 88 "Optical Gain in a Strained-Layer Quantum-Well Laser"; Doyeol Ahn and Shun-Lien Chuang Electronic Letters, 31 Mar. 84; Vol 30 #7, Pg 566–8 "Low Threshold Operation of Tensile-Strained GaIn/AIGaInP MQW LDs Emitting at 625 nm"; Tanaka, Yanagisawa, Takamoto, Yano and Minagawa.

The invention provides a means for selecting laser parameters to control the characteristics of the beam for specific applications. The combination of the focusing lens with the above mentioned beam can have such applications as requiring resolution of upwards of 1600 lines per inch as with a long working distance. Such applications exist in photoscanners, and high resolution laser printing. In manufacturing of Integrated Circuits, submicron resolution of a focused spot is required. Also, in the area of high density compact disk, a submicron size focused spot is required.

The invention also provides a general solution to beam spot image selection that is easily accomplished by a simple means that can be adapted to existing systems to provide beam shape size, and polarization selection for existing practical commercial laser wavelengths. If the novel laser device is used with a multiquantum well visible laser, an even smaller spot can be obtained, or a small thin line segment can be formed. The focused beam can be made smaller in proportion to the wavelength and the polarization can be selectable. Alternatively, the beam can be made large in an expansion mode producing a large beam spot or a broad line segment based upon the semiconductor junction and beam orientation.

BRIEF DESCRIPTION OF THE INVENTION

Where polarization is required to be along one axis, and a shorter wavelength; e.g., 630 nanometers, for high resolution, a shorter wavelength visible laser, which is called a Multiquantum Well laser, is used. The direction of polarization is along the major axis of the ellipse shaped beam emanating from the semiconductor laser. The fabrication method for this laser is different from the Index Guide/ Gainguided semiconductor laser and, because of stability or fabrication methods, the polarization orientation has been changed in comparison with the Index Guide laser semiconductor.

The same beam shaping prism pair configuration producing an expanded circular beam applies to the 630 nanometer Multiquantum Well laser. However, because of the polarization difference, an anti reflection (AR) coating for the TE wave polarization must be placed along the hypotenuse of each prism of the beam shaper in the enlarging orientation with respect to the laser beam.

If the Multiquantum Well laser is used with polarization orientation along the major axis, and the beam shaper prisms are oriented to shrink the beam in the SHRINK MODE for a small circular beam or thin line character—no hypotenuse coating is needed. In general an AR coating for TM optimum transmission and a Small Circular Beam is desirable. However, using a Multiquantum Well.(MQW) laser and beam shaper in the SHRINK mode to obtain a Small Circular Beam spot, no AR coating is required. The MQW laser used with the beam shaper in the SHRINK mode to obtain a Thin Line beam spot, the AR coating for passing the TE momde is desirable.

The 635 nanometer Multiquantum Well Laser with a small circular beam spot in the SHRINK mode, can be a direct replacement for the Helium-Neon Laser in a much more compact device.

Attaching a compact driver module with CW or Modulation, the portable Helium-Neon laser replacement, with direct modulation capability, is obtained.

There are beam spot shapes other than circles, large, or small. Collimated beams forming relatively long lines or very narrow lines also have important applications. Polarization of the beam is also important for some applications. In accordance with the invention, changing the polarization axis at the semiconductor laser; enlarging the major axis to make the beam larger for a large broad line image, and shrinking the minor axis to make a thin line image, are capabilities of the invention. Two linear beam spot shapes and orientations are possible with the instant invention. These are accomplished by mode orientations of prismatic beam shaper in the beam shaper section of the novel laser device in addition to antireflection (AR) coating for TE polarizations, and selection of the diode having the desired beam polarization. There are basically eight lasers available for unique image, polarization, beam resolution, as well as objective optics, by making the following changes:

1) wavelength changes, using both the Multiquantum Well 635 nanometers, and Index-guided 670, 780, and 830 nanometer lasers for example. The wavelength can be changed by switching the semiconductor module for the desired wavelength semiconductor.

2) beam spot shaping and polarization indexing. This is done by the 180 degree orientation reversal of a two-prism beam shaper for expanding the beam spot or reducing the beam spot size.

3) Polarization of the image is determined by a combination of the semiconductor laser having a desired polarization direction and the beam shaper having the desired transmission characteristics, and orienting the semiconductor for the desired beam spot image.

4) Providing the objective optics; i.e., the \ /2, \ /4 etc. wave plate to transmit a collimated beam, or optical lens focusing the beam or expanding the beam to provide a choice of eight different combinations constituting eight unique laser beam sources.

BRIEF DESCRIPTION OF THE DRAWINGS

FIG. 1 is a three dimensional view of the invention depicting the changeable modules of the laser device, consisting of the semiconductor module, the beam shaper and polarizer module, and objective lens modules in alignment.

FIG. 1A shows schematically the eccentric offset junction that joins the modules and adjusts the beam alignment between modules by setting the relative axial displacement and angular position therebetween.

FIG. 2 shows the Beam shape and polarization of the radiation emanating from a laser diode in relation to the semiconductor junction. It is also a three dimensional illustration of the polarization of the Index Guide (24) and the Multiquantum Well (23) semiconductor laser.

FIG. 3 shows the orientation of the prisms for expansion of the cross section of the radiated beam. FIG. 3A shows the orientation of the prisms for reduction or shrinking the cross section of the radiated beam.

FIG. 4 shows objective optics including an objective lens and filter in the objective optics module. Alternatively, for unfocused beam projection, the objective optics module houses is a quarter or half wave plate.

FIG. 4A shows typical focused objective beam spots or beam shapes useful in specific applications of the laser device including circular and linear shapes.

FIG. 4B shows unfocused beam spots or beam shapes useful in specific applications of the laser device including circular and linear shapes.

FIG. 6 is a drawing of a representative three layered coating illustrating the composition and layer thickness.

FIG. 7 is a drawing of a three dimensional view of the invention depicting the changeable block sections of the laser device, consisting of the semiconductor block, the beam shaper and polarizer block, and objective optics block in alignment.

DETAILED DESCRIPTION OF THE INVENTION

Figure 5:
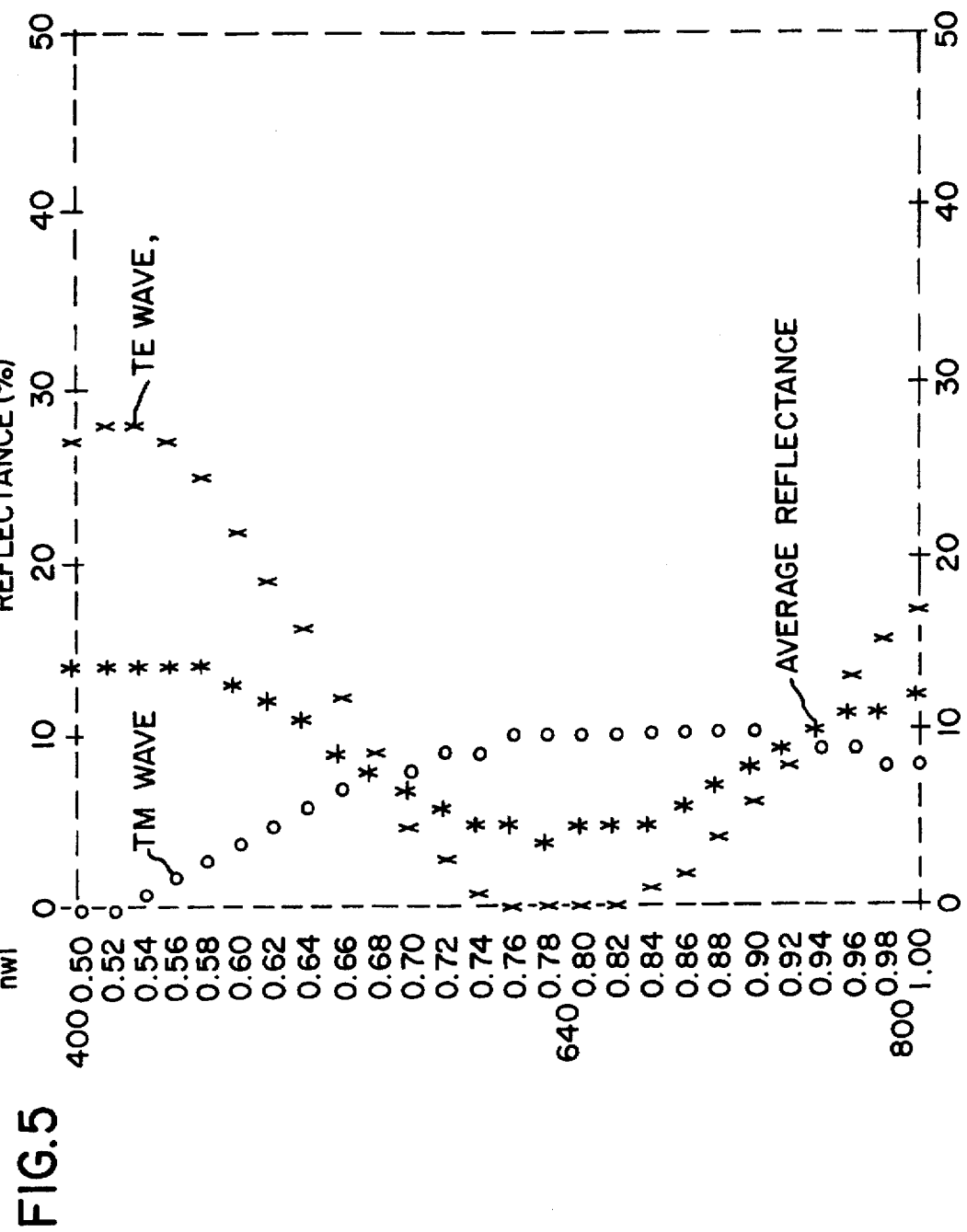
FIG. 5 is a graph that shows the reflectance of a three layered anti-reflection coating to TE and TM mode waves, for variations in normalized wavelength.

Referring now to FIG. 1, we see the modular tube sections of the laser device, coupled together by precision coupling means including frictional, screw-thread or clamp means. However, turret switching of the tubular modules is also possible in another embodiment within the scope of the invention. FIG. 1 is a three dimensional view of the invention depicting the changeable parts of the laser device, consisting of the semiconductor module 11, the beam shaper and polarizer module 12, coupled together to form one of eight combinations of beam shapes and polarizations, creating one of the eight laser configurations described in Table 1. Objective optics or telecentric beam expander section 14 can be added to create specific effects.

An implementation that is advantageous for many systems employing semiconductor lasers is the block construction in lieu of the tubular construction of FIG. 1. The block construction shown in FIG. 8 enables the laser beam to be referenced to a flat surface or optics table for precision alignment. The same modular sections 11, 12 and 14 apply to this block construction as in the tubular construction of FIG. 1.

Table 1 is listing of eight combinations of the three module laser device consisting of the semiconductor laser/collimator section, and beam shaper-polarizer section required to produce the resultant output beam cross section and polarization of the laser device. Reference is made to FIG. 4A a, b, c, and d which shows examples of beam spot shapes and relative sizes of output beam cross section characters. When the objective optics module 14 is added to the laser device, the focused beam spot as shown and discussed with reference to FIG. 4B is obtained.

TABLE I

| Semiconductor module 11<br>Beam shape and polarization | Prism Configuration<br>module 12 | Beam Shape,<br>Polarization | Focused Spot<br>Objective |
|---|---|---|---|
| Index Guide Laser - wavelengths 670, 690, 780, 810, 830, 980 etc.<br>Gain guide nanometers, same as Multiquantum Well | | | |
| TE polarization | Expansion mode, | large circle | small spot |
| Polarization along minor | Expand minor axis | FIG. 4A b | Horizontal |
| axis of beam ellipse | of beam. | Horiz. polar. | FIG. 4B j |
| FIG. 2 #24. Diode junction | No AR coating required | | |
| along minor axis of beam | if R = <1.6% | | |
| Polarize parallel to jct. | TM no coating | | |
| TE polarization | Shrink mode | small circle | large spot |
| Polarization along minor | Shrink major axis of | Vert. polar. | Vertical |
| axis of beam ellipse | beam | FIG. 4A a | polar. |
| FIG. 2 #24. Diode junction | TE requires AR coat | | FIG. 4B i |
| along minor axis of beam | on hypotenuse | | |
| Polariz. parallel to jct. | | | |

TABLE I-continued

| Semiconductor module 11 Beam shape and polarization | Prism Configuration module 12 | Beam Shape, Polarization | Focused Spot Objective |
|---|---|---|---|
| TE polarization Polarization along minor axis of beam ellipse FIG. 2 #24. Diode junction along minor axis of beam Polariz. parallel to jct. | Expansion mode Expand major axis TE requires AR coat on hypotenuse | large line vert. polar. FIG. 4A c | small, thin line Vertical polar. FIG. 4B k |
| TE polarization Polarization along minor axis of beam ellipse FIG. 2 #24. Diode junction along minor axis of beam Polariiz. parallel to jct. | Shrink mode Shrink minor axis No AR coating req'd if R = <1.6% | short, thin line horiz. polar. FIG. 4A d | broad line Horizontal polar. FIG. 4B l |
| MultiQuantum Well, 460, 488, 530, 633, 690, 780, 810, 870, 980, nm 1310, 1550 nm wavelength | | | |
| Polarization along major axis of beam ellipse Polarization perpendicular to junction TM as defined by waveguide FIG. 2 #24 | Expansion mode Expand minor axis of beam TE requires AR coat on hypotenuse | large circle Vert. polar. FIG. 4A f | small spot Vertical polar. FIG. 4B n |
| Polarization along major axis of beam ellipse Polarization perpendicular to junction TM as defined by waveguide FIG. 2 #24 | Shrink mode Shrink major axis No AR coating req'd if R = <1.6% | small circle horiz. polar FIG. 4A l | large spot Horizontal polar. FIG. 4B m |
| Polarization along major axis of beam ellipse Polarization perpendicular to junction TM as defined by waveguide FIG. 2 #24 | Expansion mode Expand major axis No AR coating req'd if R = <1.6% | large line horiz. polar FIG. 4A g | small thin line. Horizontal polar. FIG. 4B o |
| Polarization along major axis of beam ellipse Polarization perpendicular to junction TH as defined by waveguide FIG. 2 #24 | Shrink mode Shrink minor axis TE requires AR coat on hypotenuse | short, thin line vert. polar. FIG. 4A h | Broad line Vertical polar. FIG. 4B p |

Note: TE and TM modes as noted in the Semiconductor column are as defined by waveguide theory; the TE and TM modes noted in the Prism Configuration column are as defined in PRINCIPLES OF OPTICS; Borne and Wolf; Pergamon Press page 52.

Referring back to FIG. 1, the beam intensity profile is oval shaped 3:1. The beam is collimated and corrected for astigmatism using a lens 25 and a cylinder lens 26. Depending upon the application of the laser, a choice of semiconductor laser 21 is made, considering the wavelength, and polarization direction. The major axis of the elliptically diverging beam is perpendicular to the semiconductor junction 22 as shown in FIG. 2. The minor axis 24 of the beam is along the semiconductor junction in the normal mounting position of this type of diode. After the beam divergence is corrected and collimated, it is then shaped to shrink-in perpendicular to the junction using 2 identical prisms as shown in FIG. 3A and obtain a 1.125 mm diameter output beam. The beam divergence is 1 mRad, and the beam has a Gaussian distribution; there is no truncation. If the beam is truncated by an aperture in the objective optics module, diffraction rings appear making the beam appear blurred unless an edge gradient density filter is used in the objective optics module. Alternatively a Bessel transform circular grating filter which spreads any diffraction rings radially outwardly, can be used, producing a beam spot reduced about 30 percent of the beam diffraction size.

Referring now to FIG. 3, the combination of two prisms is called the beam shaper, which can be either an expander configuration module 12 for the expansion mode, or a reducer for the shrink mode. The shrink mode is shown as an example in the figures. The right angle surface of the prisms may both have multilayer or single layer dielectric thin film coatings to pass the TE and TM wave effectively. Incidence angle of the beam to the right angle facet is at or near 0 degrees.

The beam enters the prism 18, perpendicular to the surface, then refracts at the hypotenuse side. This demagnification along the plane of the paper is as shown in FIG. 3A. Normal to the plane of the paper, there is no change in magnification.

The refractive index of the prism is N. The entrance beam diameter is E, and the exit side beam is 0. The beam 0 is smaller than E, therefore the beam is demagnified. The apex angle of the prism is i.

then N sin i=sin i, We obtain demagnification:

$$m = E/O = \cos i/\cos i = \frac{\cos\{\arcsin(N \sin I)\}}{\cos i}$$

When 2 prisms are used the beam is shaped at a demagnification factor of M=m exp 2 (see Adachi et al. U.S. Pat. No. 4,609,258)

Using 2 prisms of Flint glass N=1.614 at 670 nm and correcting the beam's 3:1 oval shape to circular shape, the prism apex angle i is 34.4 degrees and outgoing angle from hypotenuse surface i is 65.76 degrees. Because this is close to the Brewster angle, where the polarization at the surface of a medium is the angle whose tangent is equal to the refractive index of the medium, the TE wave is reflected 28% but the TM wave is 1.6% reflected, and transmits with little loss. However, the TE wave must also be transmitted with no loss to preserve the brightness of the laser radiation. This is accomplished by demagnifying the beam shape. The laser diode has to be rotated 90 degrees with respect to the magnifying scheme of prior U.S. Pat. No. 4,609,258 (FIG. 1) and the beam passing in the opposite direction. In order to accomplish this, a multilayer dielectric coating is applied to the hypotenuse side of the two prisms to minimize the TE wave reflection. This solution is:

For diode laser wavelength 670 nm,

|  | Refractive Index | Normalized Thickness | Material |
| --- | --- | --- | --- |
| Double layer: | L:N = 1.38 | 1 | MgF2 |
|  | H:N = 2-2.22 Glass | 1 | TiO2/ZrO2 |
| Triple layer: | L:N = 1.38 | 1 | MgF2 |
|  | H:N = 2-2.2 | 1 | TiO2/ZrO2 |
|  | M:N = 1.6 Glass | 1 | Al2O3 |

Substrate glass F2, N = 1.614

In either a double or a triple layer case reflection of TE wave is minimum (0.2%) and less than 1% with 50 nm band width as shown in the results of calculations in FIG. 5; this bandwidth covers wavelength shift by ambient temperature change. For a temperature change from 0 to 40 degrees C., the wavelength shift is less than 10 nm.

In FIG. 1 we see the diode laser 21, the collimator 25, the cylinder lens 26. In the beam shaper module, the beam shaper consisting of the two prisms 18 and 19, each having a multilayered coating on the hypotenuse for TE and no coating or a polarization enhanced coating for TM. It will be noted that since the laser diode orientation has been rotated 90 degrees, the beam enters at 68 degrees to the prism 18, being elongated vertically and, when entering the beam shaper it is refracted and then demagnified by the prism 19. The multilayer thin films on 18 and 19 pass the TE polarized light substantially without loss.

An explanation of the process of TE and TM mode enhancement using films on a prism pair is given in U.S. Pat. No. 5,321,717 Diode Laser having Minimal Beam Diameter and Optics.

A general reference in the Optical Engineering field wherein the TE and TM modes are treated in detail is:
Introduction to Modern Optics; Grant R. Fowles; Holt, Reinhart, and Winston, Inc.

The text, page 49, line 16, to page 49, line 22, is incorporated herein by reference.

It should be noted that by the proper combination of coatings and the two beam shaper orientations for enlarging and shrinking can provide a laser in accordance with any one of the combinations listed in Table 1, producing any one of eight laser embodiments having unique characteristics for many specific commercial applications presently in existence.

Referring to FIG. 2, a semiconductor laser radiator 21 has an orientation of the semiconductor junction 22 wherein the elliptical beam shape major axis is perpendicular to the length of the diode junction. An Index Guide, Gain Guided, and certain MultiQuantum Well lasers have horizontal polarization, i.e., the polarization is along the minor axis of the beam ellipse. This is the horizontal polarization that is characteristic of the diode. In the more recently developed Multiquantum Well laser semiconductor, the polarization direction is reversed. The polarization direction is perpendicular to the junction or along a major diameter of the beam. With the semiconductors housed in modules with collimation and cylinder lenses, the wavelength of the laser and the polarization are selectable by changing modules. The theremoelectric cooler 27 laser driver in the semiconductor module holds the wavelength at its designated value.

Similarly, referring to FIG. 3, the two beam shaper modules 12 house prism sets, one for enlarging, and FIG. 3A for shrinking or reducing the size of the beam. These modules 12 are interchangeable and selectable by joining the module 12 to the semiconductor module 11, FIG. 1, by insertion into a flange, adjustable by means of an eccentric offset flange pair, holding the two modules 11, 12 together and transmitting the laser beam through the beam shaper prisms. Eccentric flange, FIG. 1A, 12b of 12 is adjustable to offset any shifting of the beam due to the anamorphic prism pair by rotating the module 12 with respect to 11. The beam passing through the beam shaper module 12 passes through an objective optics module 14 which for most applications contains only a quarter or half wave plate and optional filters. In other configurations related to the focused beam lasers as defined in Table 1, column 4, The objective optics module 14 contains lenses and filters such as the Bessel transform filter for reducing the size of the beam spot to sub-micrometer size, or an edge gradient filter to control the intensity uniformity. Referring to FIG. 4, the function of the objective optics modules is apparent; for example lens 41 focuses the beam from the beam shaper module to a point 43 for example, and filter 42. The focal point 43 has a beam spot image as in FIG. 4B i, j, k, l, m, n, o, or p, an depending upon the selection of modules 11 and 12, giving the combinations of beam shaping and semiconductor modules to provide the specific laser configuration selected from TABLE I.

The beam shaper module 12 is extremely important in controlling the laser characteristics insofar as the size of the output beam, and its brightness are concerned. The beam size is controlled by using either an EXPANSION mode orientation to obtain a large circle, or a 180 degree module reversal producing a SHRINK mode and a small millimeter beam diameter. The brightness of the beam is controlled by reducing losses of the laser semiconductor emission through the optical modules. The brightness is preserved through the beam shaper modules by using anti-reflection (AR) coatings on the prisms as described in the following.

In FIG. 5, the vertical ordinate is normalized wavelength in ¼ wave units. The abscissa is reflectance in %. The zero reflectance is 100% transmittance. The reflection becomes minimum at 0.8 nwl. Because the wavelength is 670 nm, the 0.8 nwl thickness is 0.8×670/4=134 nanometers.

FIG. 6 shows the compositions applied as thin film antireflection coatings to the hypotenuses of the prisms of the beam shapers. For a glass F2 having an index of refraction N=1.164, a first coating of Aluminum Oxide would be applied 134 nanometers optical thickness, and having an index of refraction of 1.6. A second coating of Titanium Oxide 134 nm optical thickness having an index of refraction 2 would be applied; then a layer of Magnesium Fluoride 134 nanometers optical thickness having an index of refraction of 1.38 would be applied. In the configuration shown in FIG. 3A, these coatings will produce a bright TE mode of propagation providing full laser power to the beam for precision instrument applications. On right angle sides of prisms, ordinary single or multi-layer AR coating can be applied.

FIG. 7 is an isometric drawing of the laser device showing a block module construction for optical reference systems. It shows the same modularity as the tubular embodiment; the diode laser 11, the collimator 12, the cylinder lens, and in the beam shaper section, the beam shaper consisting of the two prisms 18 and 19, each having a multilayered coating on the hypotenuse. It will be noted that since the laser diode orientation has been rotated 90 degrees, the beam enters normal to the prism 18, being elongated vertically and, when entering the beam shaper it is refracted and then demagnified by the prism 19. The multilayer thin films on 18 and 19 pass the TE mode substantially without loss.

It should be noted that the novel semiconductor laser device as described herein above is a device that is modular and can readily be changed by coupling modular sections to produce any one of eight laser configurations for a broad spectrum of applications, using a minimum of components, and affording compatibility with tubular or reference table mounting. A set of semiconductor modules covering wavelengths and polarizations of interest in specific technologies can be coupled to one of two beam shaping module orientations maintaining full brightness by the proper combination of prism coatings and the two beam shaper orientations for enlarging and shrinking can provide a laser in accordance with any one of the combinations listed in Table 1, producing any one of eight laser embodiments and projected directly to a beam application through a wave plate or objective optics module to provide large and small circular beams as well as broad and narrow line segments. Resolution enhancing, diffraction limiting, and edge filters may be used in the objective optics module for special effects.

While the foregoing discloses the preferred embodiments of the present invention, it is recognized that modifications, alterations, and other modes of operation of the invention will be apparent to those skilled in the art, and consequently it is intended that the following claims be interpreted as having these variations included therein.

What is claimed is:

1. A device for selecting laser characteristics of wavelength, beam shape, beam spot character size and shape, and polarization mode, which comprises:

means for selecting one from a group of semiconductor lasers that has a desired wavelength and polarization, and applying power thereto to radiate a laser beam having a known polarization and beam shape;

means for selecting one from a group of prismatic beam shapers, each one of said group having prism orientation for either expanding or shrinking a laser beam spot size, and each prism having antireflection coatings on the hypotenuse thereof for enhancing the TE or TM mode polarization orientation transmission therethrough, imparting a beam shape and polarization to the beam transmitted by said selected semiconductor laser device beam;

means for selecting one from a group of focusing and non-focusing optics configurations for radiating the collimated beam from the selected prismatic beam shaper to a plane for presentation of the beam shape cross section thereon; and for selecting one from a group of focusing optics configurations for radiating a focused beam from the selected prismatic beam shaper to an objective plane for presentation of the focused spot thereon;

whereby large and small circular characters and wide and thin line characters in any polarization, collimation, and resolution are projected to an objective plane.

2. The device for selecting laser characteristics of wavelength, beam spot character size and shape, and polarization mode, as described in claim 1, wherein said means for selecting one from a group of semiconductor lasers, means for selecting one from a group of prismatic beam shapers and means for selecting one from a group of objective optics, are tubular modular units held together in coaxial alignment by retaining means having coaxial alignment adjustment means.

3. The device for selecting laser characteristics of wavelength, beam spot character size and shape, and polarization mode, as described in claim 1, wherein said means for selecting one from a group of semiconductor lasers, means for selecting one from a group of prismatic beam shapers, and means for selecting one from a group of objective optics, are modular block housing units held together in coaxial alignment by retaining means having axial alignment adjustment means.

4. A device for selecting laser characteristics of wavelength, beam spot character size and shape, and polarization mode, as described in claim 1, wherein said means for selecting one from a group of objective optics, is a focusing lens projecting a small, diffraction limited spot wherein the limiting aperture is a shaped character, imparting a symbol to the beam.

5. A device for selecting laser characteristics of wavelength, beam spot character size and shape, and polarization mode, as described in claim 1, wherein said means for selecting one from a group of objective optics, is a telecentric expander to reduce a beam divergence enabling a beam to be projected over a long distance for ranging and identification of articles.

6. A device for selecting laser characteristics of wavelength, beam spot character size and shape, and polarization mode, as described in claim 1, further comprising a wavelength and power controller consisting of:

thermoelectric cooler means in thermal contact with said semiconductor laser; and heat sink means in thermal contact with said thermoelectric cooler, dissipating excess heat to ambient;

whereby the semiconductor laser wavelength is held to specifications.

7. A device for selecting laser characteristics of wavelength, beam spot character size and shape, and polarization mode, as described in claim 1, further comprising a diode laser driver consisting of a power supply providing DC power to said semiconductor diode, said power supply being regulated to provide constant power to said semiconductor diode.

8. A device for selecting laser characteristics of wavelength, beam spot character size and shape, and polarization mode, as described in claim 1, further comprising a diode laser wavelength controller comprising:

thermoelectric cooler means, in thermal contact with said semiconductor laser;

a power supply providing power to said semiconductor diode, said power supply having regulator means to provide constant current to said thermoelectric cooler means; and discriminator means adapted to detect a change in wavelength, connected to said regulator means, regulating power output of said power supply to maintain constant wavelength, whereby a variation in wavelength is detected by said discriminator means which regulates power to the semiconductor laser in a direction for correcting the wavelength.

9. A laser device having a plurality of selectable modes of operation, which comprises:

semiconductor means for emitting a beam of laser electromagnetic radiation between 400 and 1600 nanometers wavelength, said beam substantially elliptical in cross section having an elongated dimension;

a collimation lens in the beam of said semiconductor, collimating the beam thereof, producing a collimated beam of elliptic cross section;

a cylinder lens receiving the collimated beam from said collimation lens, correcting astigmatism of the beam;

a beam shaper spot size reducer of the TE polarized beam, consisting of:

a first prism having a right angular surface receiving the collimated elliptic cross section beam from said cylinder lens, and a hypotenuse surface oriented along the elongated dimension of said semiconductor means and refracting the beam having a collimated elliptic cross section from said cylinder lens, producing a circular beam output of reduced spot size; and a layered reflectance coating on the hypotenuse of the prism receiving the electromagnetic radiation TE and TM modes passing both modes and preventing reflection of the TE and TM modes at large incidence angles;

a second prism receiving the less elliptic refracted beam having a collimated, less elliptic cross section from said first prism, on a right angular facet and a hypotenuse surface refracting the beam and redirecting the circular beam output from said first prism; and a layered reflectance coating on the hypotenuse of the prism receiving the electromagnetic radiation TE and TM modes, passing both modes and preventing reflection of TE and TM modes at the large incidence angle;

whereby radiation from the diode laser means is collimated and corrected for astigmatism, by the collimating and cylinder lenses, and the beam shaped, spot size reduced and redirected by the beam shaping and demagnifying prisms to obtain a circular output beam of one millimeter diameter with minimal radiated power loss.

10. A laser device having a plurality of selectable modes of operation as described in claim 9 wherein said beam shaper is a spot size expander, which comprises:

a first prism having a hypotenuse surface receiving the collimated elliptic cross section beam from said cylinder lens, and a right angular surface oriented along the elongated dimension of said semiconductor means and refracting the beam having a collimated elliptic cross section from said cylinder lens, producing a circular beam output of enlarged spot size; and a layered reflectance coating on the hypotenuse of the prism receiving the electromagnetic radiation TE and TM modes passing both modes and preventing reflection of the TE and TM modes at a large incidence angle;

a second prism receiving the less elliptic refracted beam having a collimated less elliptic cross section from said first prism, on a hypotenuse surface and a right angular surface refracting the beam and redirecting the circular beam output from said first prism; and a layered reflectance coating on the hypotenuse of the prism receiving the electromagnetic radiation TE and TM modes, passing both modes and preventing reflection of both modes at the large incidence angle.

11. A laser device having a plurality of selectable modes of operation as described in claim 9 wherein said semiconductor means for emitting a beam of laser electromagnetic radiation substantially elliptical in cross section, having a polarization direction along the junction; and a major axis perpendicular to the junction and said beam shaper is an expander, expanding the minor axis, producing a large circle having polarization along the minor axis of the ellipse.

12. A laser device having a plurality of selectable modes of operation as described in claim 9 wherein said semiconductor means for emitting a beam of laser electromagnetic radiation substantially elliptical in cross section having an elongated dimension along the minor axis of the junction and said beam shaper is a reducer, for shrinking the major axis of the ellipse, producing a small circle having polarization along the minor axis of the ellipse.

13. A laser device having a plurality of selectable modes of operation, as described in claim 9 wherein said semiconductor means for emitting a beam of laser electromagnetic radiation substantially elliptical in cross section having an elongated dimension along the major axis of the junction and said beam shaper is an expander, expanding the major axis of the ellipse, producing a large line having polarization along the minor axis of the ellipse.

14. A laser device having a plurality of selectable modes of operation, as described in claim 9 wherein said semiconductor means for emitting a beam of laser electromagnetic radiation substantially elliptical in cross-section having an elongated dimension along the minor axis of the junction and said beam shaper is a reducer, producing a small thin line having polarization along the major axis.

15. A laser device having a plurality of selectable modes of operation, as described in claims, 11, 12, 13, and 14 wherein said semiconductor means for emitting a beam of laser electromagnetic radiation is a multiquantum well visible laser having a direction of polarization along the major axis of the beam, operating at wavelengths simulating a Helium Neon laser.

16. The method for producing laser beam output having changeable characteristics producing any one of a plurality of unique combinations of characteristics including wavelength, beam shape, beam spot character size and shape, and polarization mode, which comprises the steps of:

selecting a first module from a group of modules having laser semiconductors that have a desired wavelength and polarization and applying power thereto to radiate a laser beam having a desired polarization and beam shape;

selecting, and aligning a second module with said first module, one prismatic beam shaper from a plurality of prismatic beam shaper modules, each one of said group having prism orientation for either expanding or shrinking a laser beam spot size, and each prism having antireflection coatings on the hypotenuse thereof for enhancing the TE or TM mode polarization orientation transmission therethrough, the prismatic beam shapers imparting a beam shape and polarization to the beam transmitted by said first module selected semiconductor laser device beam;

selecting and aligning a third module with said second module, for selecting one from a group of optics elements including lenses, transform filters or beam collimators for radiating a beam from the selected prismatic beam shaper of said second module to an objective plane for presentation of the spot image thereon;

whereby a large or a small circular character and wide or thin line character in any polarization, collimation, and resolution can be selected and projected to an objective plane.

* * * * *